(12) United States Patent
Ji

(10) Patent No.: US 12,082,402 B2
(45) Date of Patent: Sep. 3, 2024

(54) ANTI-FUSE READOUT CIRCUIT, ANTI-FUSE MEMORY, AND TESTING METHOD

(71) Applicant: CHANGXIN MEMORY TECHNOLOGIES, INC., Hefei (CN)

(72) Inventor: Rumin Ji, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 221 days.

(21) Appl. No.: 17/828,017

(22) Filed: May 30, 2022

(65) Prior Publication Data

US 2023/0209815 A1 Jun. 29, 2023

(30) Foreign Application Priority Data

Dec. 24, 2021 (CN) .......................... 202111602087.6

(51) Int. Cl.
*G11C 17/18* (2006.01)
*G11C 17/16* (2006.01)
*G11C 29/00* (2006.01)
*H03K 19/20* (2006.01)
*H10B 20/20* (2023.01)

(52) U.S. Cl.
CPC ............. *H10B 20/20* (2023.02); *G11C 17/16* (2013.01); *G11C 17/18* (2013.01); *G11C 29/789* (2013.01); *H03K 19/20* (2013.01)

(58) Field of Classification Search
CPC ..... G11C 17/16; G11C 29/027; G11C 29/789; G11C 7/106; G11C 17/18; G11C 29/1201; G11C 7/1057; G11C 16/26
See application file for complete search history.

(56) References Cited

U.S. PATENT DOCUMENTS

| 6,574,763 | B1* | 6/2003 | Bertin ................ | G01R 31/287 324/750.05 |
| 2013/0021854 | A1* | 1/2013 | Huang ................ | G11C 17/18 365/189.011 |
| 2015/0241509 | A1* | 8/2015 | Lee ...................... | G11C 7/12 324/762.05 |

FOREIGN PATENT DOCUMENTS

WO 2003034331 A1 4/2003

* cited by examiner

*Primary Examiner* — Uyen Smet
(74) *Attorney, Agent, or Firm* — Kilpatrick Townsend & Stockton LLP

(57) ABSTRACT

An anti-fuse readout circuit, an anti-fuse memory, and a testing method are provided. The anti-fuse readout circuit includes: a latch circuit configured to latch data read out from an anti-fuse storage array; and a transmission circuit connected to an output terminal of the latch circuit, the transmission circuit being configured to transmit data latched in the latch circuit to a data port in response to a read test command.

22 Claims, 4 Drawing Sheets

ANTI-FUSE READOUT CIRCUIT, ANTI-FUSE MEMORY, AND TESTING METHOD

CROSS REFERENCE TO RELATED APPLICATION

This application claims priority to Chinese Patent Application No. 202111602087.6, titled "ANTI-FUSE READOUT CIRCUIT, ANTI-FUSE MEMORY, AND TESTING METHOD" and filed to the China National Intellectual Property Administration on Dec. 24, 2021, the entire contents of which are incorporated herein by reference.

TECHNICAL FIELD

Embodiments of the present disclosure relate to the field of semiconductor technology, and more particularly, to an anti-fuse readout circuit, an anti-fuse memory, and a testing method.

BACKGROUND

One-time programmable devices based on anti-fuse technologies are widely used in various chips, such as dynamic random access memory (DRAM) chips. Defective memory cell address information may be stored in the anti-fuse programmable devices by means of the anti-fuse programmable devices, to implement redundant replacement, such as row replacement or column replacement.

To ensure that data stored in the anti-fuse programmable devices have higher accuracy, generally the stored data are tested. However, at present when the data stored in the anti-fuse programmable devices are tested, there is a problem that a test result is poor in authenticity.

SUMMARY

Embodiments of the present disclosure provide an anti-fuse readout circuit, an anti-fuse memory and a testing method.

One embodiment of the present disclosure provides an anti-fuse readout circuit, including: a latch circuit configured to latch data read out from an anti-fuse storage array; and a transmission circuit connected to an output terminal of the latch circuit. The transmission circuit is configured to transmit data latched in the latch circuit to a data port in response to a read test command.

Correspondingly, the embodiment of the present disclosure also provides an anti-fuse memory, including: an anti-fuse storage array; and the anti-fuse readout circuit provided by above embodiment.

Correspondingly, the embodiment of the present disclosure also provides a testing method. The testing method may be configured for testing by means of the anti-fuse readout circuit provided by above embodiment. The testing method includes: reading data from the anti-fuse storage array and latching the data; transmitting the latched data to a data port in response to a read test command; and determining whether the data transmitted to the data port meets expectations.

BRIEF DESCRIPTION OF THE DRAWINGS

Exemplary descriptions are made to one or more embodiments with reference to pictures in the corresponding drawings, and these exemplary descriptions do not constitute limitations on the embodiments. Unless otherwise stated, the figures in the accompanying drawings do not constitute a scale limitation. To describe the technical solutions of the embodiments of the present disclosure or those of the prior art more clearly, the accompanying drawings required for describing the embodiments will be briefly introduced below. Apparently, the accompanying drawings in the following description are merely some embodiments of the present disclosure. To those of ordinary skills in the art, other accompanying drawings may also be derived from these accompanying drawings without creative efforts.

DETAILED DESCRIPTION

As can be known from the background art, at present when data stored in anti-fuse programmable devices are tested, there is a problem that a test result is poor in authenticity. It is found through analysis that one of reasons for the poor authenticity of the test result is that at present, the data stored in the anti-fuse programmable device may be first latched into a latch circuit through a broadcast path, and next the data locked in the latch circuit are compared with current address information to determine whether memory cells in a DRAM chip are defective. When testing accuracy of the data stored in the anti-fuse programmable device, the data stored in the anti-fuse programmable device are transmitted to a data port by means of an anti-fuse readout path and an FIFO (First Input First Output) circuit, and next the data in the data port are read and tested. However, the broadcast path and the anti-fuse readout path are two different paths, such that the data in the data port may be not consistent with the data in the latch circuit, which may cause that a test result obtained by testing the data in the data port cannot truly reflect the accuracy of the data latched in the latch circuit, making the test result poor in authenticity.

Embodiments of the present disclosure provide an anti-fuse readout circuit, in which a transmission circuit is additionally arranged, such that the data latched in the latch circuit may be transmitted to the data port by means of the transmission circuit. That is, the data transmitted to the data port in a test phase are the data from the latch circuit. As thus, the data in the data port collected in the test phase come from the latch circuit, such that the test result obtained by testing the data in the data port may truly reflect whether the data in the latch circuit are accurate. In this way, the accuracy of the test result can be improved.

The embodiments of the present disclosure will be described in detail below in conjunction with the accompanying drawings. However, a person of ordinary skill in the art may understand that in the embodiments of the present disclosure, many technical details are put forward such that a reader may better understand the present disclosure. However, the technical solutions requested to be protected by the present disclosure may also be implemented even without these technical details or various variations and modifications based on the following embodiments.

Figure 1:
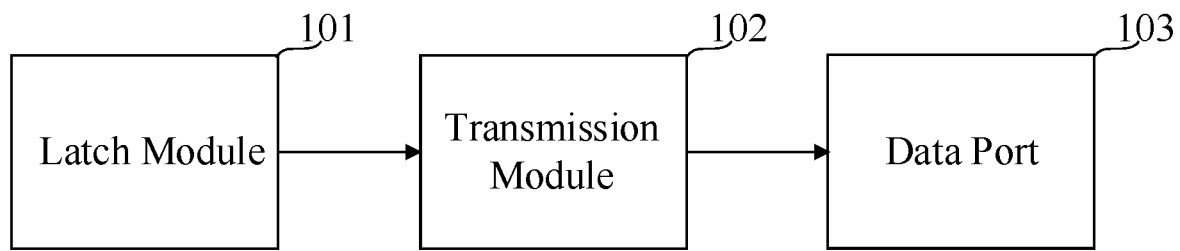
FIG. 1 is a functional block diagram of an anti-fuse readout circuit according to an embodiment of the present disclosure.

FIG. 1 is a functional block diagram of an anti-fuse readout circuit according to an embodiment of the present disclosure.

Referring to FIG. 1, the anti-fuse readout circuit includes: a latch circuit 101 configured to latch data read out from an anti-fuse storage array; and a transmission circuit 102 connected to an output terminal of the latch circuit 101. The transmission circuit 102 is configured to transmit data latched in the latch circuit 101 to a data port 103 in response to a read test command RD.

That is, in the test phase, the transmission circuit 102 is enabled in response to the read test command RD, and the data latched in the latch circuit 101 may be transmitted to the data port 103 by means of the transmission circuit 102. As thus, when the data in the data port 103 are collected for testing, this is equivalent to collecting the data in the latch circuit 101 for testing, such that the test result obtained by testing the data in the data port 103 may truly reflect whether the data in the latch circuit 101 are accurate.

The latch circuit 101 is configured to latch the data read out from the anti-fuse storage array. When the latch circuit 101 is enabled, the data of the anti-fuse storage array may be transmitted to the latch circuit 101 and are latched. The transmission circuit 102 is configured to transmit the data in the latch circuit 101. In some embodiments, when the read test command RD is at a high level, the transmission circuit 102 is enabled, and the data in the latch circuit 101 may be transmitted to the data port 103 by means of the transmission circuit 102. When the read test command RD is at a low level, the transmission circuit 102 is disabled, and the data in the latch circuit 101 cannot be transmitted to the data port 103 by means of the transmission circuit 102. As thus, the transmission circuit 102 may transmit, in response to the read test command RD, the data in the latch circuit 101 to the data port 103 for testing. In some other embodiments, when the read test command RD is at a low level, the latch circuit 101 is enabled; and when the read test command RD is at a high level, the latch circuit 101 is disabled. In some embodiments, the data port 103 may be a DQ port.

Figure 2:
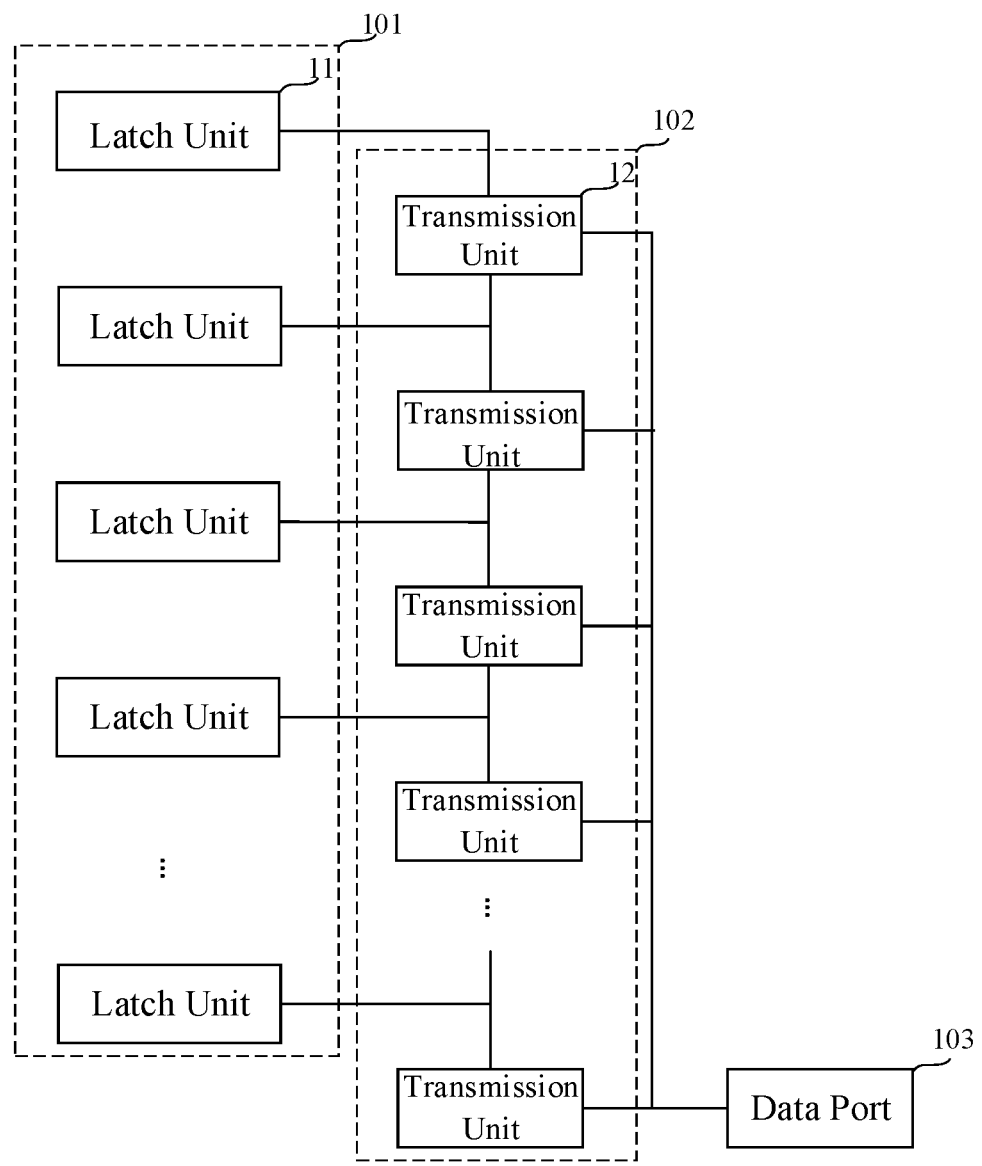
FIG. 2 is a functional block diagram of another anti-fuse readout circuit according to an embodiment of the present disclosure.

Referring to FIG. 2, FIG. 2 is another functional block diagram of the anti-fuse readout circuit according to the embodiments of the present disclosure. In some embodiments, number of bits of data is multibit. The latch circuit 101 includes: a multichannel latch subcircuit 11, wherein each channel of the latch subcircuit 11 is configured to latch one bit of data in the data read out from the anti-fuse storage array. The transmission circuit 102 includes: a plurality of transmission subcircuits 12, wherein each of the plurality of transmission subcircuits 12 is connected to an output terminal of the corresponding latch subcircuit 11, and each of the plurality of transmission subcircuits 12 is configured to respectively transmit, in response to different read test commands RD, the one bit of data latched in the corresponding latch subcircuit 11 to the data port 103. The different read test commands RD received by each of the plurality of transmission subcircuits 12 refer to a fact that the read test commands RD have different timing sequences. The multichannel latch subcircuit 11 is provided to latch more data in the anti-fuse storage array. The multichannel latch subcircuit 11 is connected to the plurality of transmission subcircuits 12 correspondingly, such that the data in the multibit latch circuit 101 may be transmitted to the data port 103 for testing. Each time a given one of the plurality of transmission subcircuits 12 receives the read test command RD, the given transmission subcircuit 12 transmits one bit of data in the latch subcircuit 11 to the data port 103. By setting different timing sequences of the read test commands RD received by each of the plurality of transmission subcircuits 12, each of the plurality of transmission subcircuits 12 may transmit the data latched in the latch subcircuit 11 to the data port 103 one by one according to different timing sequences. As thus, the data in the data port 103 may be separately tested, such that the test result is more accurate.

Figure 3:
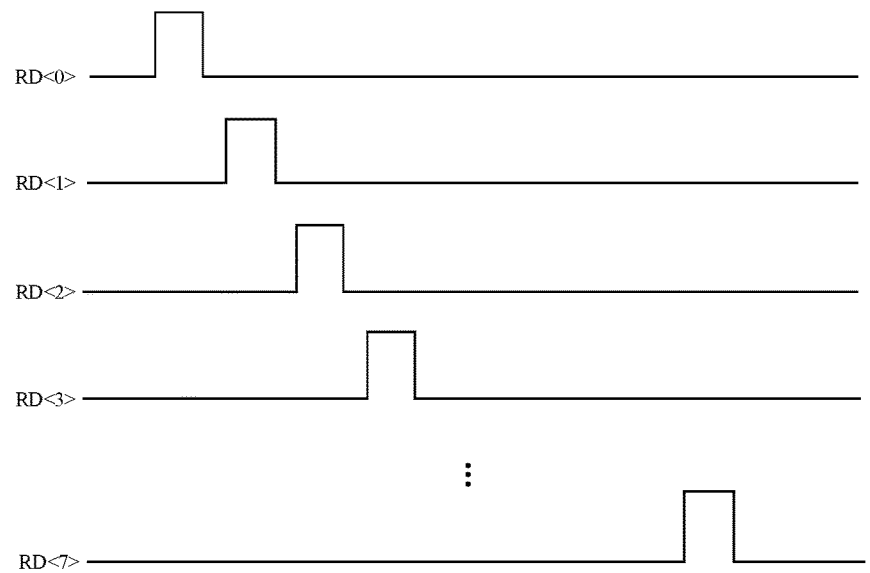
FIG. 3 is a timing sequence diagram of a read test command according to an embodiment of the present disclosure.

Referring to FIG. 3, FIG. 3 is a timing sequence diagram of a read test command according to an embodiment of the present disclosure. In some embodiments, an example is taken where the number of bits of the data read out from the anti-fuse storage array is eight bits, wherein the read test commands RD corresponding to different transmission subcircuits 12 are respectively denoted as: $RD_0$, $RD_1$, . . . , and $RD_7$. The timing sequences of the read test commands RD corresponding to each of the plurality of transmission subcircuits 12 are different, which may avoid a problem that different transmission subcircuits 12 simultaneously transmit one bit of data in different latch subcircuits 11 to the data port 103, such that every time only one bit of data in the data port DQ may be tested, thereby ensuring the accuracy of the test result. In some embodiments, the read test command RD may be provided by a read test command generation circuit. In some other embodiments, the read test command RD may also be provided by an external circuit.

Figure 4:
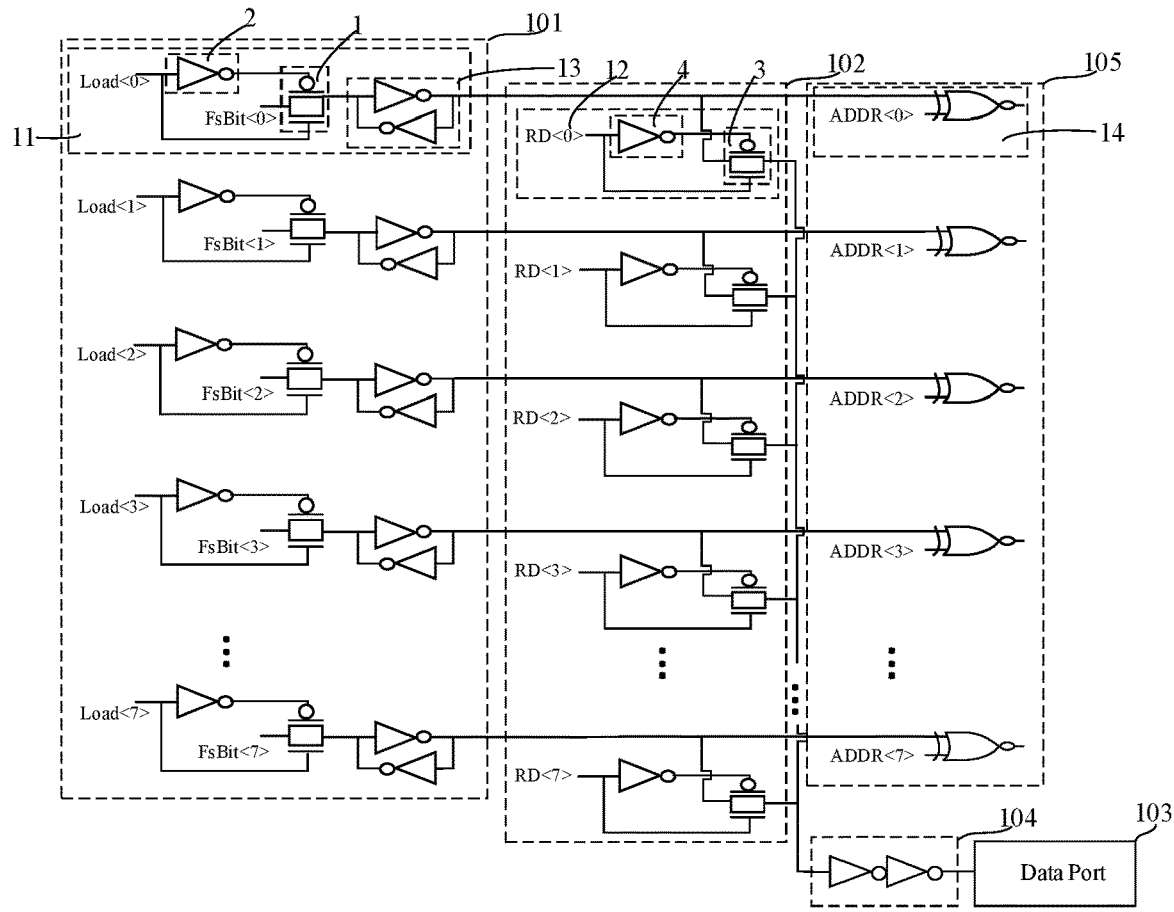
FIG. 4 is a circuit diagram of an anti-fuse readout circuit according to an embodiment of the present disclosure.

Referring to FIG. 4, FIG. 4 is a circuit diagram of the anti-fuse readout circuit according to an embodiment of the present disclosure. In some embodiments, the latch subcircuit 11 includes: a first switch transistor 1 configured to receive the one bit of data, wherein the first switch transistor 1 is enabled in response to a location strobe signal, such that an output terminal of the first switch transistor 1 outputs the one bit of data; and a latch circuit 13. An output terminal of the latch circuit 13 is connected to each of the plurality of transmission subcircuits 12, and an input terminal of the latch circuit 13 is connected to the output terminal of the first switch transistor 1. In some embodiments, there are a plurality of latch subcircuits 11, and an example is taken where the number of bits of the data read out from the anti-fuse storage array is eight bits, wherein the location strobe signals corresponding to different latch subcircuits 11 are respectively denoted as: Load<0>, Load<1> . . . , and Load<7>; and the one bit of data received by different latch subcircuits 11 are respectively denoted as: FsBit<0>, FsBit<1> . . . , and FsBit<7>. The input terminal of the latch circuit 13 is connected to the output terminal of the first switch transistor 1 to receive the one bit of data outputted from the output terminal of the first switch transistor 1 and latch the one bit of data. The output terminal of the latch circuit 13 is connected to each of the plurality of transmission subcircuits 12. When each of the plurality of transmission subcircuits 12 is enabled, the data latched in the latch circuit 13 may be transmitted to the data port 103 via each of the plurality of transmission subcircuits 12. In some embodiments, the latch circuit 13 may be constituted by two inverters connected end to end.

In some embodiments, the anti-fuse readout circuit also includes a broadcast path subcircuit, wherein an input terminal of the broadcast path subcircuit is connected to the anti-fuse storage array, and an output terminal of the broadcast path subcircuit is connected to the input terminal of the latch subcircuit 11. One bit of data in the anti-fuse storage array are transmitted to the first switch transistor 1 via the broadcast path subcircuit, and the location strobe signal may be generated by the broadcast path subcircuit. In some embodiments, the location strobe signal is at a high level, the first switch transistor 1 is enabled, and meanwhile, one bit of data corresponding to the location strobe signal are transmitted to the first switch transistor 1 via the broadcast path subcircuit.

In some embodiments, taking the location strobe signal Load<0> as an example, when Load<0> is at a high level, the first switch transistor 1 is enabled, and FsBit<0> is transmitted to the latch circuit 13. When Load<0> is at a low level, the first switch transistor 1 is disabled, and FsBit<0> cannot be transmitted to the latch circuit 13 by means of the first switch transistor 1. It is to be understood that in some other embodiments, when Load<0> is at a low level, the first switch transistor 1 is enabled; and when Load<0> is at a high level, the first switch transistor 1 is disabled. In some embodiments, after FsBit<0> is transmitted to the latch circuit 13, when a read test signal is at a high level, the transmission circuit 102 is enabled, and FsBit<0> may be transmitted to the data port 103 via the transmission circuit 102; and when the read test command RD is at a low level, the transmission circuit 102 is disabled, and FsBit<0> cannot be transmitted to the data port 103 via the transmission circuit 102.

In some embodiments, the first switch 1 is a first transmission gate, a first control terminal of the first transmission gate is configured to receive the location strobe signal, and an input terminal of the first transmission gate is configured to receive the one bit of data. The latch subcircuit 11 also includes a first inverter 2, wherein an input terminal of the first inverter 2 is configured to receive the location strobe signal, and an output terminal of the first inverter 2 is connected to a second control terminal of the first transmission gate. The first transmission gate and the first inverter 2 jointly constitute one analog switch, and are enabled in response to the location strobe signal. Taking the location strobe signal Load<0> as an example, when Load<0> is at a high level, the first control terminal of the first transmission gate receives a high level corresponding to logic "1", the input terminal of the first inverter 2 receives the high level corresponding to logic "1", and the output terminal of the first inverter 2 outputs a low level corresponding to logic "0". The output terminal of the first inverter 2 is connected to the second control terminal of the first transmission gate. Therefore, the second control terminal of the first transmission gate receives the low level corresponding to logic "0", the first transmission gate is enabled, and FsBit<0> is transmitted to the latch circuit 13. In some other embodiments, the first switch transistor 1 may also be other logic gate circuit such as a PMOS transistor or an NMOS transistor. When the logic circuit is the PMOS transistor or the NMOS transistor, a gate of the PMOS transistor or NMOS transistor is connected to the latch circuit 13, and the gate is enabled in response to the location strobe signal.

In some embodiments, the transmission subcircuit 12 includes a second switch transistor 3. The second switch transistor 3 is enabled in response to the read test command RD, to transmit the one bit of data to the data port 103. Taking an example where the read test command RD is $RD_0$, when $RD_0$ is at a high level, the second switch 3 is enabled, and FsBit<0> is transmitted to the data port 103; and when $RD_0$ is at a low level, the second switch 3 is disabled, and FsBit<0> cannot be transmitted to the data port 103 by means of the first switch transistor 1. It is to be understood that in some other embodiments, when $RD_0$ is at a low level, the second switch transistor 3 is enabled; and when $RD_0$ is at a high level, the second switch transistor 3 is disabled.

In some embodiments, the second switch transistor 3 includes a second transmission gate, wherein a first control terminal of the second transmission gate is configured to receive the read test command RD, and an input terminal of the second transmission gate is configured to receive the one bit of data. Each of the plurality of transmission subcircuits 12 also includes a second inverter 4, wherein an input terminal of the second inverter 4 is configured to receive the read test command RD, and an output terminal of the second inverter 4 is connected to a second control terminal of the second transmission gate. The second transmission gate and the second inverter 4 jointly constitute one analog switch, and are enabled in response to the read test command RD. Taking an example where the read test command RD is $RD_0$, when $RD_0$ is at a high level, the first control terminal of the second transmission gate receives the high level corresponding to logic "1", the input terminal of the second inverter 4 receives the high level corresponding to logic "1", and the output terminal of the second inverter 4 outputs the low level corresponding to logic "0". The output terminal of the second inverter 4 is connected to the second control terminal of the second transmission gate. Therefore, the second control terminal of the second transmission gate receives the low level corresponding to logic "0", the second transmission gate is enabled, and FsBit<0> is transmitted to the data port 103. In some other embodiments, the second switch transistor 3 may also be other logic gate circuit such as a PMOS transistor or an NMOS transistor. When the logic circuit is the PMOS transistor or NMOS transistor, a gate of the PMOS transistor or NMOS transistor is enabled in response to the location strobe signal, and the one bit of data are transmitted to the data port 103.

In some embodiments, the anti-fuse readout circuit also includes a buffer circuit 104 arranged between an output terminal of the transmission circuit 102 and the data port 103. The buffer circuit 104 plays a delay role. That is, compared with a case where the buffer circuit 104 is not provided, arrangement of the buffer circuit 104 makes it take longer time for the transmission circuit 102 to transmit the one bit of data to the data port 103. As thus, longer time is reserved for collecting and testing the one bit of data in the data port 103 in the test phase, such that the testing may be performed in an orderly manner.

In some embodiments, the buffer circuit 104 includes even number of inverters connected in series, wherein an input terminal of the inverter in the first location is connected to the output terminal of the transmission circuit 102, and an output terminal of the inverter in the last location is connected to the data port 103. The even number of inverters connected in series are provided as the buffer circuit 104, such that the one bit of data may still be transmitted to the data port 103 after being processed by means of the buffer circuit 104. For example, when the input terminal of the first inverter receives a high level corresponding to logic "1", the output terminal of the first inverter outputs a low level corresponding to logic "0". Because even number of inverters connected in series are provided, the logic level corresponding to the output terminal of the last inverter is still "1". That is, the input terminal of the data port 103 still receives the high level corresponding to the logic "1". Because even number of inverters connected in series are provided, a transmission speed of one bit of data becomes slow, such that buffer time is reserved for testing the one bit of data in the data port 103 in the test phase. In addition, arrangement of the inverters in the circuit makes the circuit structure simpler and the chip area smaller. It is to be understood that in some embodiments, the number of inverters may be set according to different requirements of the readout circuit, to adjust length of the buffer time. In some other embodiments, the buffer circuit 104 may also be provided as other logic gate circuits, for example, either PMOS transistors or NMOS transistors.

In some embodiments, the anti-fuse readout circuit also includes a comparison circuit 105 connected to the output terminal of the latch circuit 101. The comparison circuit 105 is configured to compare whether the data latched in the latch circuit 101 matches current address information. An input terminal of the comparison circuit 105 is connected to the output terminal of the latch circuit 101 to receive one bit of data latched in the latch circuit 101. The other input terminal of the latch circuit 101 is also configured to receive the current address information, and match the one bit of data with the current address information. In some embodiments, the data in the anti-fuse storage array are defective memory cell address information, such as defective address information in a DRAM memory cell. When the one bit of data match the current address information based on comparison of the comparison circuit 105, this indicates that an address corresponding to the current address information is a defective address. In this case, the defective address may be replaced, such that the memory cell can work normally. The transmission circuit 102 is arranged in the anti-fuse readout circuit, so in the test phase, the transmission circuit 102 may transmit the data in the latch circuit 101 to the data port 103 one by one. Next, the data in the data port 103 are tested one by one to test the accuracy of the data latched in the latch circuit 101, such that the data in the latch circuit 101 have a higher accuracy. Therefore, the comparison circuit 105 is arranged in the same readout circuit, to compare the tested data in the latch circuit 101 with the current address information, such that the comparison result has a higher accuracy. In this way, a defective address in the memory cell can be more accurately found out, to ensure the normal operation of the memory cell and maintain better performance of the memory cell.

In some embodiments, the comparison circuit 105 includes a plurality of comparison subcircuits 14. An input terminal of each of the plurality of comparison subcircuits 14 is connected to the output terminal of one latch subcircuit 11 to receive one bit of data latched in the latch subcircuit 11 and compare the one bit of data with the current address information. The plurality of comparison subcircuits 14 are connected to the latch subcircuits 11 in a one-to-one correspondence, such that each of the plurality of comparison subcircuits 14 may simultaneously receive one bit of data latched in the corresponding latch subcircuit 11, so the comparison circuit 105 has a higher working efficiency.

In some embodiments, the comparison circuit 105 includes an XNOR gate, wherein an input terminal of the XNOR gate is connected to the output terminal of the latch circuit 101, and other input terminal of the XNOR gate is configured to receive the current address information. A working principle of the XNOR gate is as follows: when both the two input terminals of the XNOR gate receive a high level or a low level, a high level is outputted; when one of the two input terminals of the XNOR gate receives a high level and the other input terminal of the XNOR gate receives a low level, a low level is outputted. Based on the working principle of the XNOR gate, when one bit of data received from the latch circuit 101 by one of the two input terminals of the XNOR gate have the same logic level as a current address received by the other input terminal of the XNOR gate, the XNOR gate outputs a high level. In this case, it is considered that the one bit of data received from the latch circuit 101 matches the current address information. When the one bit of data received from the latch circuit 101 by one of the two input terminals of the XNOR gate have a logic level opposite to the current address received by the other input terminal of the XNOR gate, the XNOR gate outputs a low level. In this case, it is considered that the one bit of data received from the latch circuit 101 does not match the current address information. In some embodiments, the current address information received by the XNOR gate may be provided by an external circuit. In some other embodiments, the current address information received by the XNOR gate may also be provided by an address signal generation circuit of the memory.

In some embodiments, the comparison circuit 105 includes a plurality of comparison subcircuits 14, and the input terminal of each of the plurality of comparison subcircuits 14 is connected to the output terminal of one latch subcircuit 11. In some embodiments, an example is taken where the number of bits of the data read out from the anti-fuse storage array is eight bits, the current address information corresponding to each of the plurality of comparison subcircuits 14 is denoted as: ADDR<0>, ADDR<1>, and ADDR<7>. Taking the current address information being ADDR<0> as an example, when one of the two input terminals of the XNOR gate receives FsBit<0> corresponding to a logic level "1" and the other input terminal of the XNOR gate receives ADDR<0> corresponding to the logic level "1", the XNOR gate outputs a high level having the logic level "1". In this case, it is considered that FsBit<0> matches ADDR<0>. When one of the two input terminals of the XNOR gate receives FsBit<0> corresponding to a logic level "0" and the other input terminal of the XNOR gate receives ADDR<0> corresponding to the logic level "0", the XNOR gate outputs the high level having the logic level "1". In this case, it is considered that FsBit<0> matches ADDR<0>. When one of the two input terminals of the XNOR gate receives FsBit<0> corresponding to the logic level "0" and the other input terminal of the XNOR gate receives ADDR<0> corresponding to the logic level "1", the XNOR gate outputs the high level having the logic level "0". In this case, it is considered that FsBit<0> does not match ADDR<0>. When one of the two input terminals of the XNOR gate receives FsBit<0> corresponding to the logic level "1" and the other input terminal of the XNOR gate receives ADDR<0> corresponding to the logic level "0", the XNOR gate outputs the high level having the logic level "0". In this case, it is considered that FsBit<0> does not match ADDR<0>.

It is to be understood that in other embodiments, the comparison circuit 105 may also be other logic gate circuit, as long as the comparison circuit 105 can compare whether the data latched in the latch circuit 101 matches the current address information.

In some embodiments, the transmission circuit 102 is also configured to transmit the data latched in the latch circuit 101 to the same data port 103. That is, when the latch circuit 101 includes a plurality of latch subcircuits 11 and the transmission circuit 102 includes a plurality of transmission subcircuits 12, each of the plurality of transmission subcircuits 12 is connected to the same data port 103, and data latched in each of the plurality of latch subcircuits 11 are transmitted to the same data port 103 one by one. As thus, when the data latched in the plurality of latch subcircuits 11 need to be tested, it is only needed to collect the data in the same data port 103 one by one, and then test the data collected.

Figure 5:
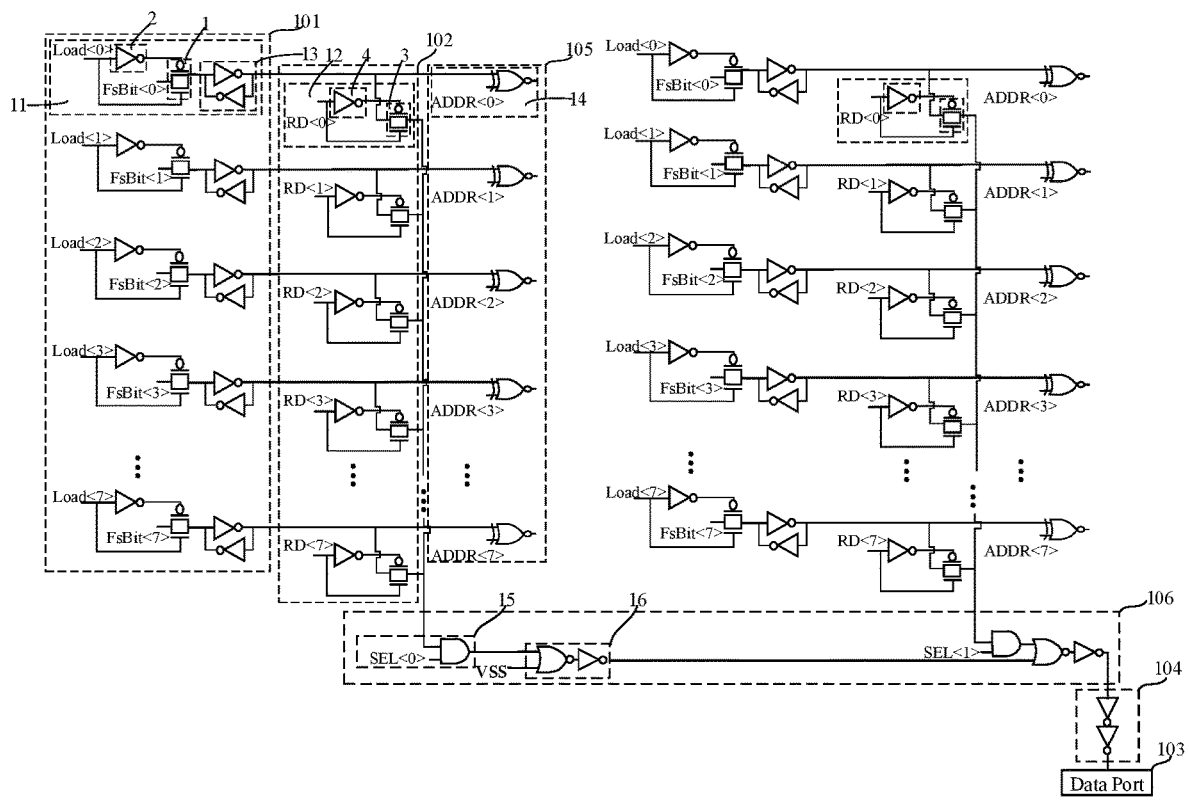
FIG. 5 is a circuit diagram of another anti-fuse readout circuit according to an embodiment of the present disclosure.

Referring to FIG. 5, FIG. 5 is a circuit diagram of another anti-fuse readout circuit according to an embodiment of the present disclosure. In some embodiments, the anti-fuse readout circuit includes a plurality of latch circuits 101 and a plurality of transmission circuits 102. The anti-fuse readout circuit also includes a selection circuit 106 connected to output terminals of the plurality of transmission circuits 102, wherein the selection circuit 106 is configured to select a given one of the plurality of transmission circuits 102 to transmit the data from the given transmission circuit 102 to the data port 103. In the test phase, when the selection circuit 106 is enabled, the selection circuit 106 transmits the data outputted from one of the plurality of transmission circuits 102 to the data port 103. By providing the selection circuit 106, when there are provided with a plurality of latch circuits 101 and a plurality of transmission circuits 102 in the circuit, the data in different latch circuits 101 may be transmitted to the same data port 103 by means of the plurality of transmission circuits 102 one by one in the test phase. As thus, it is not only advantageous to improving the accuracy of the test results, but also advantageous to improving the test efficiency by testing more data in the anti-fuse storage array in the same circuit.

In some embodiments, the selection circuit 106 may include: a plurality of selection output subcircuits 15, wherein each of the plurality of selection output subcircuits 15 corresponds to one of the plurality of transmission circuits 102, and the plurality of selection output subcircuits 15 are configured to output the data transmitted by the plurality of transmission circuits 102 in response to a selection signal; and a switch subcircuit 16 connected between output terminals of the plurality of selection output subcircuits 15 and the data port 103. The switch subcircuit 16 is configured to transmit the data outputted from the plurality of selection output subcircuits 15 to the data port 103. The switch subcircuit 16 is arranged between each of the plurality of transmission subcircuits 12 and the data port 103. That is, the data transmitted by the plurality of transmission circuits 102 need to be transmitted to the data port 103 by means of the plurality of selection output subcircuits 15 and the switch subcircuit 16. By providing the switch subcircuit 16, when one of the plurality of transmission subcircuits 12 transmits the data in the plurality of transmission circuits 102 to the data port 103 based on the selection signal, the switch subcircuit 16 connected to a given one of the plurality of transmission subcircuits 12 that has not received the selection signal may filter out a logic signal corresponding to the data in the corresponding one of the plurality of transmission circuits 102, such that the data currently transmitted to the data port 103 are only the data in the given transmission circuit 102 selected based on the selection signal. In this way, the data in different transmission circuits 102 may be transmitted to the data port 103 one by one for testing, such that the test result is more accurate. In some embodiments, the selection signal may be provided by an external circuit. In some other embodiments, the selection signal may also be provided by an internal circuit of the memory. For example, the selection signal may be provided by a selection signal generation circuit. It is to be understood that in some other embodiments, the selection circuit 106 may also be other logic gate circuit such as a multiplexer (MUX).

In some embodiments, each of the plurality of selection output subcircuits 15 includes an AND gate circuit, wherein an input terminal of the AND gate circuit is configured to receive the selection signal, and other input terminal of the AND gate circuit is configured to receive the data outputted from the plurality of transmission circuits 102. The working principle of the AND gate circuit is as below. When both the two input terminals of the AND gate circuit receive a high level, the high level is outputted; when either one of the two input terminals of the AND gate circuit receives a low level, the low level is outputted. Based on the working principle of the AND gate circuit, one of the two input terminals of the AND gate circuit receives one bit of data with a high level from the plurality of transmission circuits 102, when the selection signal is at a high level, the other input terminal of the AND gate circuit receives the selection signal at the high level, the AND gate circuit outputs a high level. After the switch subcircuit 16 receives the high level, the plurality of transmission subcircuits 102 are connected to the data port 103 to transmit the one bit of data to the data port 103.

In some embodiments, the switch subcircuit 16 may include a multistage connected OR gate circuit, wherein each stage of the OR gate circuit corresponds to one of the plurality of selection output subcircuits 15, and an input terminal of the OR gate circuit is connected to the output terminal of the corresponding one of the plurality of selection output subcircuits 15. Other input terminal of the OR gate circuit in the first stage is grounded, an output terminal of the OR gate circuit in the last stage is connected to the data port 103, and the output terminal of the OR gate circuit in the former stage is connected to an input terminal of the OR gate circuit in the latter stage. The working principle of the OR gate circuit is as below. When either one of the two input terminals of the OR gate circuit receives a high level, the output terminal of the OR gate circuit outputs the high level. When both the two input terminals of the OR gate circuit receive a low level, the output terminal of the OR gate circuit outputs the low level. Based on the working principle of the OR gate circuit, in some embodiments, when the plurality of selection output subcircuits 15 are AND gates, the selection signal is at a high level, the one bit of data in the plurality of transmission circuits 102 are at a high level, and the output terminal of each of the plurality of selection output subcircuits 15 is at a high level. As thus, the two input terminals of the OR gate circuit receive the high level, and the output terminal of the OR gate circuit outputs the high level. In this way, the one bit of data having the high level may be transmitted to the data port 103.

The multistage OR gate circuit is provided, and the output terminal of the OR gate circuit in the former stage is connected to the input terminal of the OR gate circuit in the latter stage. For this reason, when the corresponding one of the plurality of selection output subcircuits 15 connected to the input terminal of the OR gate circuit in the former stage transmits one bit of data in the plurality of transmission circuits 102 to the OR gate circuit of the former stage based on the selection signal, the OR gate circuit in the former stage may transmit the one bit of data to the data port 103 by means of the OR gate circuit in the latter stage. That is, as long as any given one of the plurality of selection output subcircuits 15 receives the selection signal having the high level, the OR gate circuit connected to this given selection output subcircuit 15 will output the high level. The output terminal of the OR gate circuit in the former stage is connected to the input terminal of the OR gate circuit in the latter stage. For this reason, the input terminal of the OR gate circuit in each stage receives the selection signal having the high level, so the one bit of data are transmitted to the data port 103. For another given one of the plurality of selection output subcircuits 15 that do not receive the selection signal having the high level, the output terminal of this given selection output subcircuit 15 is at a low level. At this moment, a low level is inputted to one input terminal of an OR gate circuit adjacent to this given selection output subcircuit 15, a high level is inputted to the other input terminal of the OR gate circuit, and the output terminal of the OR gate circuit still outputs the high level. That is, the logic signal outputted by the given selection output subcircuit 15 that fails in response to the selection signal may be filtered out, such that only the one bit of data outputted from the plurality of selection output subcircuits 15 in response to the selection signal are transmitted to the data port 103. As thus, when the data in the data port 103 are tested, the test result is more accurate.

In some embodiments, an example is taken where the number of bits of the data read out from the anti-fuse storage array is eight bits, the plurality of selection output subcircuits 15 corresponding to each of the plurality of transmission circuits 102 are denoted as: SEL<0>, SEL<1> . . . , and SEL<7>, and the switch subcircuits 16 corresponding to each of the plurality of selection output subcircuits 15 are denoted as: S<0>, S<1> . . . , and S<7>. Taking SEL<0> and SEL<1> as examples, when one input terminal of SEL<0> receives the selection signal corresponding to a logic level "1" and the other input terminal of SEL<0> receives FsBit<0> corresponding to the logic level "1", the output terminal of SEL<0> outputs a high level corresponding to the logic level "1"; and when one input terminal of S<0> receives a high level corresponding to the logic level "1", the output terminal of S<0> outputs the high level corresponding to the logic level "1". When one input terminal of SEL<1> receives the selection signal corresponding to a logic level "0", the output terminal of SEL<1> outputs the selection signal corresponding to the logic level "0"; and when the other input terminal of S<1> receives, from SEL<1>, the selection signal corresponding to a logic level "0", because one input terminal of S<1> receives, from S<0>, a high level corresponding to the logic level "1", the output terminal of S<1> outputs the high level corresponding to the logic "1". That is, S<1> may filter out the low level corresponding to the logic level "0" outputted from the output terminal of SEL<1>, such that all the data transmitted to the data port 103 correspond to the logic level "1".

In some embodiments, the OR gate circuit may include: a NOR gate circuit, an input terminal of the NOR gate circuit being connected to the output terminal of the corresponding one of the plurality of selection output subcircuits 15; and a NOT gate circuit. An input terminal of the NOT gate circuit is connected to an output terminal of the NOR gate circuit, and an output terminal of the NOT gate circuit is connected to the input terminal of the NOR gate circuit of the OR gate in the next stage. The working principle of the NOR gate circuit is as below. When either of the two input terminals of the NOR gate circuit receives a high level, the output terminal of the NOR gate circuit outputs a low level; and when both the two input terminals of the NOR gate circuit receive a low level, the output terminal of the NOR gate circuit outputs a high level. The working principle of the NOT gate circuit is as below when the input terminal of the NOT gate circuit receives a low level, the output terminal of the NOT gate circuit outputs a high level; and when the input terminal of the NOT gate circuit receives the high level, the output terminal of the NOT gate circuit outputs the low level. Based on the working principle of the NOR gate circuit and of the NOT gate circuit, when the OR gate circuit receives a signal indicating that the NOR gate circuit is connected to the NOT gate circuit, the NOR gate circuit and the NOT gate circuit are caused to serve as an OR gate as a whole.

In some other embodiments, the switch subcircuit 16 may also include one OR gate circuit. The output terminals of the plurality of selection output subcircuits 15 all are connected to an input terminal of the OR gate circuit, and an output terminal of the OR gate circuit is connected to the data port 103. That is, only one OR gate circuit may be used as an OR gate, and number of input terminals of the OR gate circuit is equal to that of the plurality of selection output subcircuits 15. In this way, the data port 103 is connected to the plurality of selection output subcircuits 15 configured to output data, such that the one bit of data in the plurality of transmission circuits 102 are transmitted to the data port 103.

According to the technical solutions provided by the embodiments of the present disclosure, the anti-fuse readout circuit includes: a latch circuit 101 configured to latch data read out from an anti-fuse storage array; and a plurality of transmission circuits 102 connected to the output terminal of the latch circuit 101. The plurality of transmission circuits 102 are configured to transmit the data latched in the latch circuit 101 to a data port 103 in response to a read test command RD. The plurality of transmission circuits 102 are additionally arranged in the readout circuit, such that the data latched in the latch circuit 101 may be transmitted to the data port 103 by means of the plurality of transmission circuits 102. That is, the data collected from the data port in the test phase come from the latch circuit 101, which is equivalent to collecting the data in the latch circuit 101 for testing, such that the test result obtained by testing the data in the data port 103 may truly reflect whether the data in the latch circuit 101 are accurate, thereby improving authenticity of the test result.

Figure 6:
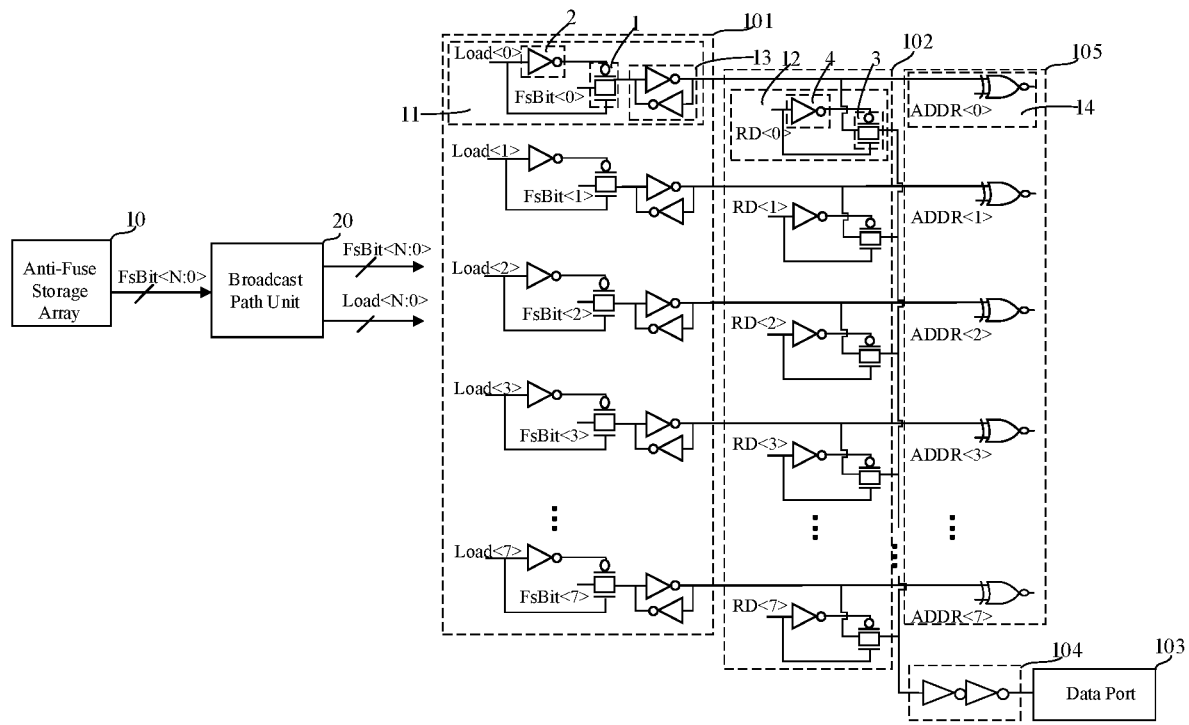
FIG. 6 is a schematic structural diagram of an anti-fuse memory according to an embodiment of the present disclosure.

Correspondingly, the embodiments of the present disclosure also provide an anti-fuse memory. Referring to FIG. 6, FIG. 6 is a schematic structural diagram of an anti-fuse memory according to an embodiment of the present disclosure. The anti-fuse memory includes: an anti-fuse storage array 10; and the anti-fuse readout circuit provided by any of the above embodiments. The anti-fuse storage array 10 is configured to store data, wherein the data stored in the anti-fuse storage array 10 may include defective memory cell address information. The data in the anti-fuse memory cell may be transmitted to the latch circuit 101 in the anti-fuse readout circuit by means of the broadcast path subcircuit for latching, and the plurality of transmission circuits 102 connected to the latch circuit 101 transmit the data latched in the latch circuit 101 to the data port 103 in response to the read test command RD. As thus, in the test phase, the data collected from the data port 103 come from the latch circuit 101, this is equivalent to collecting the data latched in the latch circuit 101 for testing, such that the test result obtained by testing the data in the data port 103 may truly reflect accuracy of the data latched in the latch circuit 101. Therefore, when the data latched in the latch circuit 101 are compared with memory cell address information in the memory, the comparison result may be made more accurate, such that the memory can work normally, and better performance of the memory may be maintained.

Figure 7:
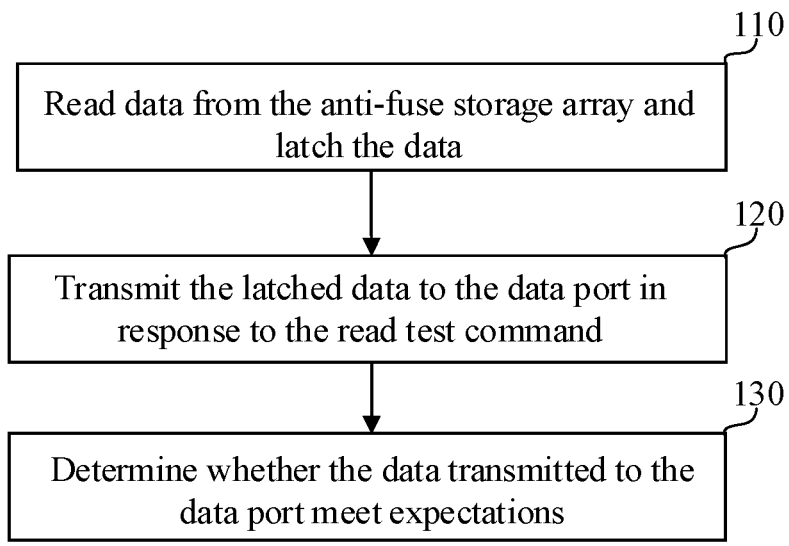
FIG. 7 is a schematic flow diagram of a testing method according to an embodiment of the present disclosure.

Correspondingly, the embodiments of the present disclosure also provide a testing method, which may be configured for testing by means of the anti-fuse readout circuit according to any one of the above embodiments. Referring to FIG. 7, FIG. 7 is a schematic flow diagram of a testing method according to an embodiment of the present disclosure. The testing method include following steps.

Step 110: reading data from the anti-fuse storage array 10 (referring to FIG. 6) and latching the data. In some embodiments, the anti-fuse readout circuit also includes a broadcast path subcircuit 20, wherein an input terminal of the broadcast path subcircuit 20 is connected to the anti-fuse storage array 10, and an output terminal of the broadcast path subcircuit 20 is connected to the input terminal of the latch subcircuit 11. One bit of data in the anti-fuse storage array 10 are transmitted to the latch circuit 101 via the broadcast path subcircuit 20 for latching.

Step 120: transmitting the latched data to the data port 103 (referring to FIG. 4) in response to the read test command RD (referring to FIG. 4). In some embodiments, in the test phase, the data in the latch circuit 101 (referring to FIG. 4) may be transmitted to the data port 103 by means of the transmission circuit 102 (referring to FIG. 4). In some embodiments, when the read test command RD is at a high level, the transmission circuit 102 is enabled, and the data in the latch circuit 101 may be transmitted to the data port 103 via the transmission circuit 102. When the read test command RD is at a low level, the transmission circuit 102 is disabled, and the data in the latch circuit 101 cannot be transmitted to the data port 103 by means of the transmission circuit 102. As thus, in the test phase, the transmission circuit 102 may transmit the data in the latch circuit 101 to the data port 103 for testing in response to the read test command RD. In some other embodiments, when the read test command RD is at a low level, the latch circuit 101 is enabled; and when the read test command RD is at a high level, the latch circuit 101 is disabled.

In some embodiments, the transmitting the latched data to the data port 103 includes transmitting one bit of data to the data port 103 at a time in response to different read test commands RD. In some embodiments, in the test phase, each time a given one of the plurality of transmission subcircuits 102 receives the read test command RD, the given transmission subcircuit 102 transmits one bit of data in the latch subcircuit 101 to the data port 103. By setting different timing sequences of the read test commands RD received by each of the plurality of transmission subcircuits 102, each of the plurality of transmission subcircuits 12 may transmit the data latched in the latch subcircuit 101 to the data port 103 one by one according to different timing sequences. As thus, the data in the data port 103 may be separately tested, such that the test result is more accurate.

Step 130: determining whether the data transmitted to the data port 103 meet expectations. In some embodiments, in the test phase, after the data in the latch circuit 101 are transmitted to the data port 103, the data in the data port 103 are collected, and the collected data are compared with data to be compared, wherein the data to be compared may be true defective address information. When the collected data are different from the data to be compared, it is considered that the data transmitted to the data port 103 do not meet expectations. However, when the collected data are the same as the data to be compared, it is considered that the data transmitted to the data port 103 meet expectations. In some embodiments, the data transmitted to the data port 103 may be collected by means of an external test machine, and then the data are compared with the data to be compared. In some other embodiments, the data transmitted to the data port 103 may also be collected manually by an engineer, and then the data are compared with the data to be compared.

In some embodiments, there are a plurality of latch circuits 101 and a plurality of transmission circuits 102. The transmitting the latched data to the data port 103 includes: in response to a selection signal, transmitting the data latched in one of the plurality of latch circuits 101 to the data port one 103 at a time. In some embodiments, the anti-fuse readout circuit also includes a selection circuit 106 (referring to FIG. 5). The selection circuit 106 is configured to select and transmit, in response to the selection signal, the data outputted by one of the plurality of transmission circuits 102 to the data port 103. In some embodiments, in the test phase, when the selection signal is at a high level, the selection circuit 106 is enabled, and the selection circuit 106 transmits the data outputted by one of the plurality of transmission circuits 102 to the data port 103. As thus, when there are a plurality of latch circuits 101 and a plurality of transmission circuits 102 in the circuit, the data in different latch circuits 101 may be transmitted to the same data port 103 one by one by means of the plurality of transmission circuits 102 to test in an orderly manner, which is advantageous to improving the accuracy of the test result. In addition, in the same circuit, more data in the anti-fuse storage array 10 may be tested, which is advantageous to improving the test efficiency.

In the testing method provided by the above embodiments of the present disclosure, data are read out from the anti-fuse storage array 10 and the data are latched. In response to the read test command RD, the latched data are transmitted to the data port 103. It is determined whether the data transmitted to the data port 103 meet expectations. That is, the data in the data port 103 are tested. That is, in the test phase, it is equivalent to collecting and testing the data in the latch circuit 101, such that the test result obtained by testing the data in the data port 103 in the test phase may truly reflect the accuracy of the data in the latch circuit 101. As thus, when the data latched in the latch circuit 101 are compared with the memory cell address information in the memory subsequently, reliability of the comparison result may be improved.

Those of ordinary skill in the art can understand that the above-mentioned embodiments are some embodiments for realizing the present disclosure, but in practical applications, various changes may be made to them in form and details without departing from the spirit and scope of the present disclosure. Any person skilled in the art can make their own changes and modifications without departing from the spirit and scope of the present disclosure. Therefore, the protection scope of the present disclosure shall be subject to the scope defined by the claims.

What is claimed is:
1. An anti-fuse readout circuit, comprising:
a latch circuit configured to latch data read out from an anti-fuse storage array; and
a transmission circuit connected to an output terminal of the latch circuit, the transmission circuit being configured to transmit data latched in the latch circuit to a data port in response to a read test command; and,
wherein the latch circuit comprises:
a multichannel latch subcircuit, each channel of the latch subcircuit being configured to latch one bit of data in the data read out from the anti-fuse storage array;
the transmission circuit comprises:
a plurality of transmission subcircuits, each of the plurality of transmission subcircuits being connected to an output terminal of the latch subcircuit, and each of the plurality of transmission subcircuits being configured to respectively transmit, in response to different read test commands, the one bit of data latched in the latch subcircuit to the data port;
wherein the latch subcircuit comprises:

a first switch transistor configured to receive the one bit of data, the first switch transistor being enabled in response to a location strobe signal, such that an output terminal of the first switch transistor outputs the one bit of data; and a latch circuit, an output terminal of the latch circuit being connected to each of the plurality of transmission subcircuits, and an input terminal of the latch circuit being connected to the output terminal of the first switch transistor.

2. The anti-fuse readout circuit according to claim 1, wherein the first switch is a first transmission gate, a first control terminal of the first transmission gate being configured to receive the location strobe signal, and an input terminal of the first transmission gate being configured to receive the one bit of data; and the latch subcircuit further comprises: a first inverter, an input terminal of the first inverter being configured to receive the location strobe signal, and an output terminal of the first inverter being connected to a second control terminal of the first transmission gate.

3. The anti-fuse readout circuit according to claim 1, wherein each of the plurality of transmission subcircuits comprises a second switch transistor, the second switch transistor being enabled in response to the read test command, to transmit the one bit of data to the data port.

4. The anti-fuse readout circuit according to claim 3, wherein the second switch transistor comprises a second transmission gate, a first control terminal of the second transmission gate being configured to receive the read test command, and an input terminal of the second transmission gate being configured to receive the one bit of data; and each of the plurality of transmission subcircuits further comprises: a second inverter, an input terminal of the second inverter being configured to receive the read test command, and an output terminal of the second inverter being connected to a second control terminal of the second transmission gate.

5. The anti-fuse readout circuit according to claim 1, further comprising:

a buffer circuit arranged between an output terminal of the transmission circuit and the data port.

6. The anti-fuse readout circuit according to claim 5, wherein the buffer circuit comprises even number of inverters connected in series, an input terminal of the inverter in the first location being connected to the output terminal of the transmission circuit, and an output terminal of the inverter in the last location being connected to the data port.

7. The anti-fuse readout circuit according to claim 1, further comprising:

a comparison circuit connected to the output terminal of the latch circuit, the comparison circuit being configured to compare whether the data latched in the latch circuit matches current address information.

8. The anti-fuse readout circuit according to claim 7, wherein the comparison circuit comprises an XNOR gate, an input terminal of the XNOR gate being connected to the output terminal of the latch circuit, and other input terminal of the XNOR gate being configured to receive the current address information.

9. The anti-fuse readout circuit according to claim 1, wherein the transmission circuit is further configured to transmit the data latched in the latch circuit to a same data port.

10. The anti-fuse readout circuit according to claim 1, wherein the anti-fuse readout circuit comprises a plurality of latch circuits and a plurality of transmission circuits, the anti-fuse readout circuit further comprising:

a selection circuit connected to output terminals of the plurality of transmission circuits, the selection circuit being configured to select a given one of the plurality of transmission circuits to transmit the data from the given transmission circuit to the data port.

11. The anti-fuse readout circuit according to claim 10, wherein the selection circuit comprises: a plurality of selection output subcircuits, each of the plurality of selection output subcircuits corresponding to one of the plurality of transmission circuits, and the plurality of selection output subcircuits being configured to output the data transmitted by the plurality of transmission circuits in response to a selection signal; and a switch subcircuit connected between output terminals of the plurality of selection output subcircuits and the data port, the switch subcircuit being configured to transmit the data outputted from the plurality of selection output subcircuits to the data port.

12. The anti-fuse readout circuit according to claim 11, wherein each of the plurality of selection output subcircuits comprises an AND gate circuit, an input terminal of the AND gate circuit being configured to receive the selection signal, and other input terminal of the AND gate circuit being configured to receive the data outputted from the plurality of transmission circuits.

13. The anti-fuse readout circuit according to claim 11, wherein the switch subcircuit comprises:

a multistage connected OR gate circuit, each stage of the OR gate circuit corresponding to one of the plurality of selection output subcircuits, and an input terminal of the OR gate circuit being connected to the output terminal of the corresponding one of the plurality of selection output subcircuits; wherein other input terminal of the OR gate circuit in the first stage is grounded, an output terminal of the OR gate circuit in the last stage being connected to the data port, and the output terminal of the OR gate circuit in the former stage being connected to an input terminal of the OR gate circuit in the latter stage.

14. The anti-fuse readout circuit according to claim 11, wherein the switch subcircuit comprises:

one OR gate circuit, the output terminals of the plurality of selection output subcircuits all being connected to an input terminal of the OR gate circuit, and an output terminal of the OR gate circuit being connected to the data port.

15. An anti-fuse memory, comprising:

an anti-fuse storage array; and the anti-fuse readout circuit of claim 1.

16. A testing method for testing by the anti-fuse readout circuit of claim 1, the testing method comprising:

reading data from the anti-fuse storage array and latching the data;

transmitting the latched data to the data port in response to the read test command; and determining whether the data transmitted to the data port meets expectations.

17. The testing method according to claim 16, wherein the transmitting the latched data to the data port comprises:

in response to different read test commands, transmitting one bit of data in the data read out to the data port one at a time.

18. The testing method according to claim 16, wherein there are a plurality of latch circuits and a plurality of transmission circuits; and the transmitting the latched data to a data port comprises:
in response to a selection signal, transmitting one bit of data in the data latched in the latch circuit to the data port one at a time.

19. An anti-fuse readout circuit, comprising:
a latch circuit configured to latch data read out from an anti-fuse storage array; and
a transmission circuit connected to an output terminal of the latch circuit, the transmission circuit being configured to transmit data latched in the latch circuit to a data port in response to a read test command;
wherein the latch circuit comprises:
a multichannel latch subcircuit, each channel of the latch subcircuit being configured to latch one bit of data in the data read out from the anti-fuse storage array;
the transmission circuit comprises:
a plurality of transmission subcircuits, each of the plurality of transmission subcircuits being connected to an output terminal of the latch subcircuit, and each of the plurality of transmission subcircuits being configured to respectively transmit, in response to different read test commands, the one bit of data latched in the latch subcircuit to the data port;
wherein each of the plurality of transmission subcircuits comprises a second switch transistor, the second switch transistor being enabled in response to the read test command, to transmit the one bit of data to the data port;
wherein the second switch transistor comprises a second transmission gate, a first control terminal of the second transmission gate being configured to receive the read test command, and an input terminal of the second transmission gate being configured to receive the one bit of data; and
each of the plurality of transmission subcircuits further comprises: a second inverter, an input terminal of the second inverter being configured to receive the read test command, and an output terminal of the second inverter being connected to a second control terminal of the second transmission gate.

20. An anti-fuse readout circuit, comprising:
a latch circuit configured to latch data read out from an anti-fuse storage array;
a transmission circuit connected to an output terminal of the latch circuit, the transmission circuit being configured to transmit data latched in the latch circuit to a data port in response to a read test command; and
a buffer circuit arranged between an output terminal of the transmission circuit and the data port;
wherein the buffer circuit comprises even number of inverters connected in series, an input terminal of the inverter in the first location being connected to the output terminal of the transmission circuit, and an output terminal of the inverter in the last location being connected to the data port.

21. An anti-fuse readout circuit, comprising:
a latch circuit configured to latch data read out from an anti-fuse storage array;
a transmission circuit connected to an output terminal of the latch circuit, the transmission circuit being configured to transmit data latched in the latch circuit to a data port in response to a read test command; and
a comparison circuit connected to the output terminal of the latch circuit, the comparison circuit being configured to compare whether the data latched in the latch circuit matches current address information;
wherein the comparison circuit comprises an XNOR gate, an input terminal of the XNOR gate being connected to the output terminal of the latch circuit, and other input terminal of the XNOR gate being configured to receive the current address information.

22. An anti-fuse readout circuit, comprising:
a latch circuit configured to latch data read out from an anti-fuse storage array; and
a transmission circuit connected to an output terminal of the latch circuit, the transmission circuit being configured to transmit data latched in the latch circuit to a data port in response to a read test command;
wherein the latch circuit comprises:
a multichannel latch subcircuit, each channel of the latch subcircuit being configured to latch one bit of data in the data read out from the anti-fuse storage array;
the transmission circuit comprises:
a plurality of transmission subcircuits, each of the plurality of transmission subcircuits being connected to an output terminal of the latch subcircuit, and each of the plurality of transmission subcircuits being configured to respectively transmit, in response to different read test commands, the one bit of data latched in the latch subcircuit to the data port;
wherein the anti-fuse readout circuit comprises a plurality of latch circuits and a plurality of transmission circuits, the anti-fuse readout circuit further comprising:
a selection circuit connected to output terminals of the plurality of transmission circuits, the selection circuit being configured to select a given one of the plurality of transmission circuits to transmit the data from the given transmission circuit to the data port.

* * * * *